US009029749B2

(12) United States Patent
Unagami et al.

(10) Patent No.: US 9,029,749 B2
(45) Date of Patent: May 12, 2015

(54) SOLID-STATE IMAGING DEVICE

(75) Inventors: Naoko Unagami, Yokohama (JP); Makoto Monoi, Tokyo (JP); Nagataka Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 734 days.

(21) Appl. No.: 13/040,968

(22) Filed: Mar. 4, 2011

(65) Prior Publication Data
US 2011/0215223 A1    Sep. 8, 2011

(30) Foreign Application Priority Data

Mar. 5, 2010 (JP) ................................. 2010-049914

(51) Int. Cl.
*H01L 27/148* (2006.01)
*H04N 5/355* (2011.01)
*H01L 27/146* (2006.01)

(52) U.S. Cl.
CPC ......... *H01L 27/148* (2013.01); *H01L 27/14627* (2013.01); *H04N 5/355* (2013.01)

(58) Field of Classification Search
CPC ............ H01L 27/146; H01L 27/14601; H01L 27/14603; H01L 27/14605; H01L 27/14607; H01L 27/625; H01L 27/14627; H01L 27/14643; H01L 27/14645; H01L 27/148; H01L 27/14806; H01L 27/14812; H01L 27/14868; H04N 5/355; H04N 5/341; H04N 5/343; H04N 5/351
USPC ............... 250/216, 208.1; 257/288, 290, 291, 257/292, 294, 431, 443, E31.054, E27.133; 348/308, 300, 229.1, 230.1
See application file for complete search history.

(56) References Cited

U.S. PATENT DOCUMENTS

| 5,592,223 | A * | 1/1997 | Takamura et al. ............. 348/309 |
| 5,955,753 | A * | 9/1999 | Takahashi ...................... 257/292 |
| 6,194,244 | B1 * | 2/2001 | Yamaguchi et al. ............ 438/57 |
| 6,787,824 | B2 * | 9/2004 | Takeuchi et al. ............... 257/258 |
| 6,831,692 | B1 * | 12/2004 | Oda ............................... 348/315 |
| 6,903,391 | B2 * | 6/2005 | Takeuchi et al. ............... 257/233 |

(Continued)

FOREIGN PATENT DOCUMENTS

| CN | 101609837 A | 12/2009 |
| JP | 8-153865 | 6/1996 |

(Continued)

OTHER PUBLICATIONS

Office Action issued May 29, 2012 in Japanese Application No. 2010-049914 (with English translation).

(Continued)

*Primary Examiner* — John Lee
(74) *Attorney, Agent, or Firm* — Oblon, McClelland, Maier & Neustadt, L.L.P.

(57) ABSTRACT

According to one embodiment, a solid-state imaging device including a plurality of pixels two-dimensionally arranged at a preset pitch in a semiconductor substrate is provided. Each of the pixels is configured to include first and second photodiodes that photoelectrically convert incident light and store signal charges obtained by conversion, a first micro-lens that focuses light on the first photodiode, and a second micro-lens that focuses light on the second photodiode. The saturation charge amount of the second photodiode is larger than that of the first photodiode. Further, the aperture of the second micro-lens is smaller than that of the first micro-lens.

20 Claims, 7 Drawing Sheets

(56) References Cited

U.S. PATENT DOCUMENTS

| | | | |
|---|---|---|---|
| 6,929,972 B2* | 8/2005 | Takeuchi et al. | 438/70 |
| 7,019,274 B2* | 3/2006 | Yamada | 250/208.1 |
| 7,189,957 B2* | 3/2007 | Fu et al. | 250/214.1 |
| 7,336,306 B2* | 2/2008 | Oda | 348/272 |
| 7,417,273 B2* | 8/2008 | Inoue et al. | 257/292 |
| 7,511,324 B2* | 3/2009 | Unagami et al. | 257/294 |
| 7,608,866 B2* | 10/2009 | Oda | 257/232 |
| 7,609,306 B2 | 10/2009 | Oda | |
| 7,864,236 B2* | 1/2011 | Sekine | 348/294 |
| 8,508,640 B2* | 8/2013 | Naruse et al. | 348/308 |
| 2002/0140832 A1 | 10/2002 | Summa | |
| 2003/0234410 A1 | 12/2003 | Takeuchi et al. | |
| 2005/0064613 A1* | 3/2005 | Takeuchi et al. | 438/24 |
| 2006/0028569 A1* | 2/2006 | Sekine | 348/308 |
| 2006/0170802 A1* | 8/2006 | Misawa | 348/297 |
| 2006/0208285 A1* | 9/2006 | Inoue et al. | 257/239 |
| 2007/0035653 A1* | 2/2007 | Hong et al. | 348/340 |
| 2007/0206110 A1* | 9/2007 | Wada | 348/340 |
| 2007/0210345 A1* | 9/2007 | Oda | 257/232 |
| 2007/0290245 A1* | 12/2007 | Unagami et al. | 257/294 |
| 2008/0018764 A1* | 1/2008 | Mizoguchi | 348/308 |
| 2008/0237761 A1* | 10/2008 | Fu et al. | 257/432 |
| 2008/0296645 A1* | 12/2008 | Itonaga | 257/294 |
| 2009/0200623 A1* | 8/2009 | Qian et al. | 257/432 |
| 2009/0251556 A1* | 10/2009 | Mabuchi | 348/222.1 |
| 2009/0295962 A1* | 12/2009 | Rhodes et al. | 348/302 |
| 2009/0303371 A1* | 12/2009 | Watanabe et al. | 348/311 |
| 2010/0013969 A1 | 1/2010 | Ui | |
| 2010/0087029 A1* | 4/2010 | Fu et al. | 438/70 |
| 2010/0117126 A1* | 5/2010 | Takahashi | 257/292 |
| 2010/0224917 A1* | 9/2010 | Yamaguchi | 257/290 |
| 2010/0244287 A1* | 9/2010 | Hsu et al. | 257/797 |
| 2011/0001861 A1 | 1/2011 | Tanaka et al. | |
| 2011/0140182 A1* | 6/2011 | Tanaka | 257/292 |
| 2011/0141333 A1* | 6/2011 | Naruse et al. | 348/308 |
| 2011/0215223 A1* | 9/2011 | Unagami et al. | 250/208.1 |
| 2011/0228149 A1* | 9/2011 | Naruse et al. | 348/273 |

FOREIGN PATENT DOCUMENTS

| | | |
|---|---|---|
| JP | 2005-286104 | 10/2005 |
| JP | 2007-242857 A | 9/2007 |
| JP | 2007258686 A | 10/2007 |
| JP | 2008-99073 | 4/2008 |
| TW | 200841459 A | 10/2008 |

OTHER PUBLICATIONS

Combined Office Action and Search Report issued Nov. 26, 2012 in Chinese Application No. 201110051858.7.

Combined Taiwanese Office Action and Search Report issued Aug. 14, 2013 in Patent Application No. 100105639 with English Translation.

Combined Chinese Office Action and Search Report issued Jan. 24, 2014 in Patent Application No. 201110051858.7 (with English language translation of the Office Action).

* cited by examiner

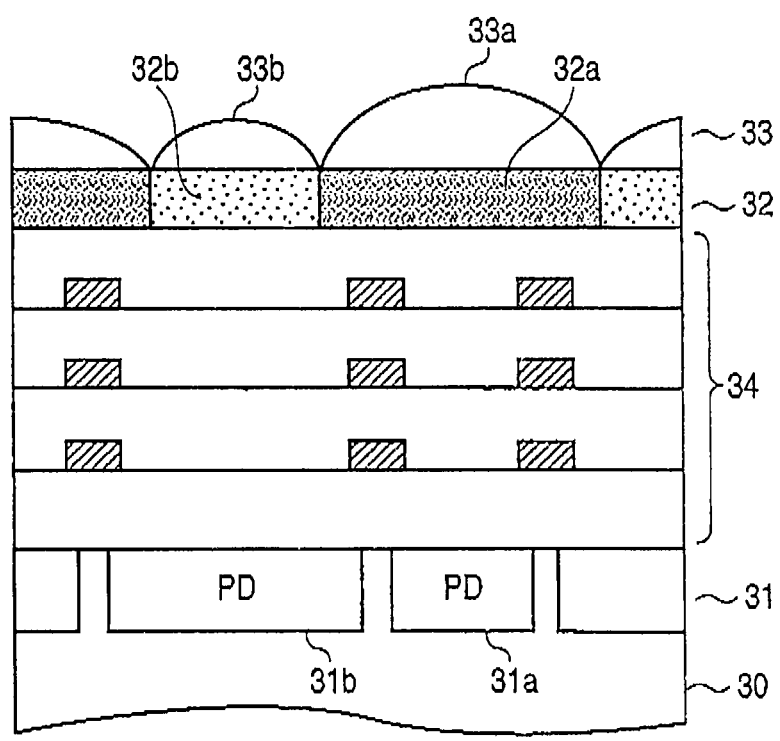
F I G. 1

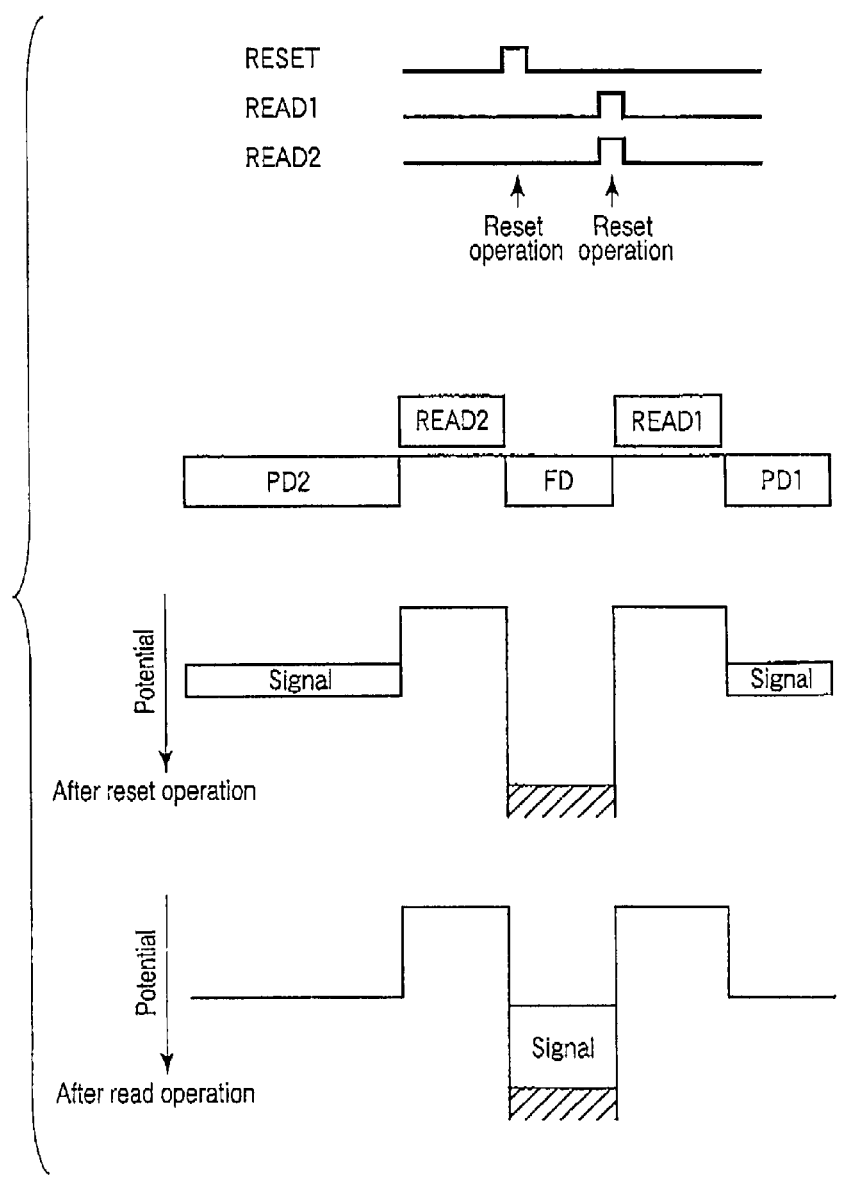
F I G. 5

SOLID-STATE IMAGING DEVICE

CROSS-REFERENCE TO RELATED APPLICATIONS

This application is based upon and claims the benefit of priority from prior Japanese Patent Application No. 2010-049914, filed Mar. 5, 2010, the entire contents of which are incorporated herein by reference.

FIELD

Embodiments described herein relate generally to a solid-state imaging device in which each unit pixel is configured by two types of pixels including high-sensitivity and low-sensitivity pixels.

BACKGROUND

Recently, the technique for arranging high-sensitivity pixels and low-sensitivity pixels adjacent to one another in an imaging region in a solid-state imaging device such as a CCD image sensor or CMOS image sensor to expand the dynamic range is proposed. In this device, the high-sensitivity pixel and low-sensitivity pixel of the same photodiode size are arranged in a single unit cell. Further, a micro-lens with a large area is arranged on the high-sensitivity pixel and a micro-lens with a small area is arranged on the low-sensitivity pixel.

However, in this type of device, the following problem occurs. That is, since an amount of signal charges generated at the low-illumination time (dark time) is small, the photodiode is not saturated. However, since an incident light amount is large at the high-illumination time (bright time), there occurs a strong possibility that not only the photodiode of the high-sensitivity pixel but also the photodiode of the low-sensitivity pixel will be saturated. Further, saturation of the low-sensitivity pixel becomes a factor to lower the dynamic range.

BRIEF DESCRIPTION OF THE DRAWINGS

FIG. 1 is a cross-sectional view showing the structure of unit pixels of a CMOS image sensor according to a first embodiment.

FIG. 5 is a diagram for illustrating the operation timings and potentials of the CMOS image sensor of FIG. 2 (in a low-illumination mode).

DETAILED DESCRIPTION

Figure 2:
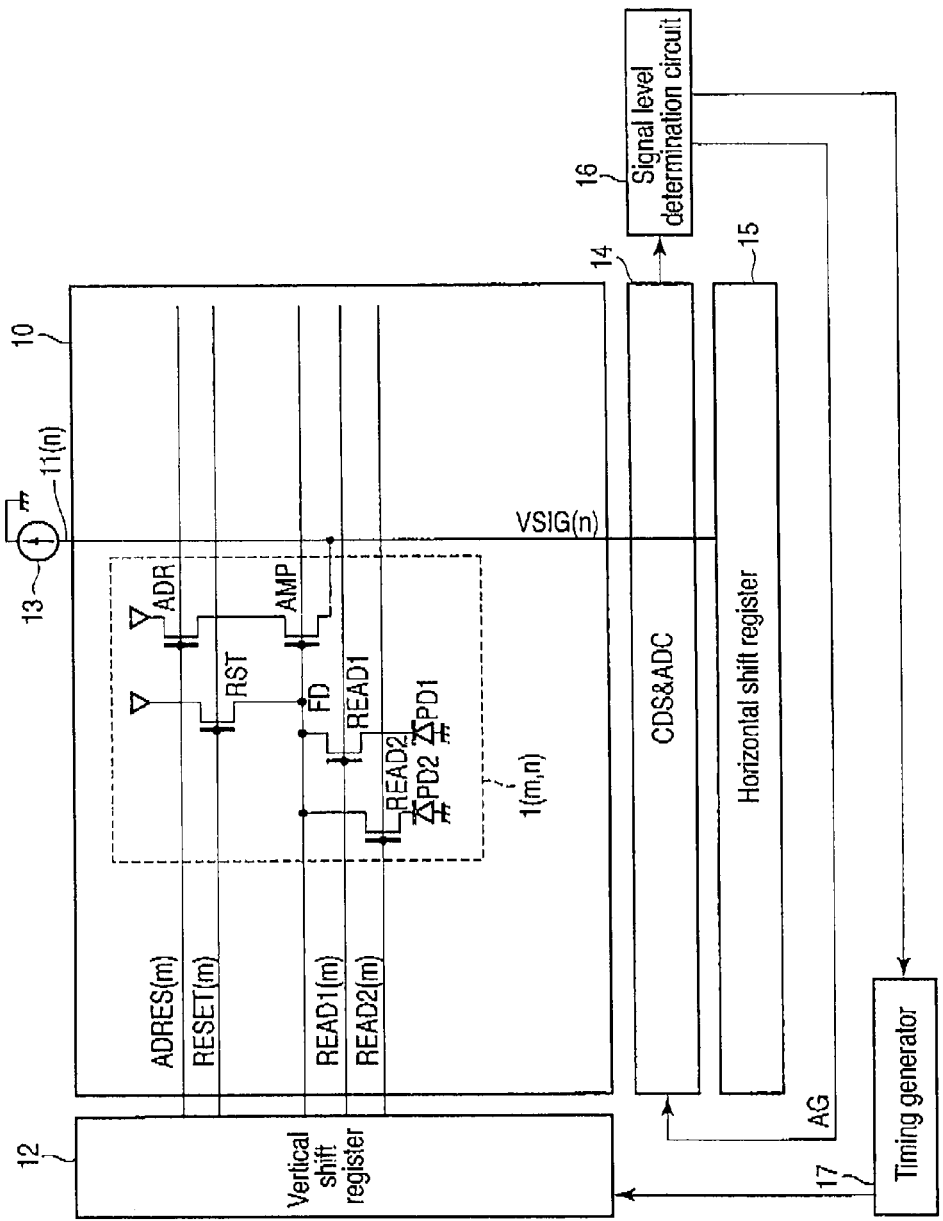
FIG. 2 is a block diagram showing the schematic configuration of a CMOS image sensor according to a second embodiment.

In general, according to one embodiment, a solid-state imaging device including a plurality of pixels two-dimensionally arranged at a preset pitch in a semiconductor substrate is provided. Each of the pixels is configured to include first and second photodiodes that photoelectrically convert incident light and store signal charges obtained by conversion, a first micro-lens that focuses light on the first photodiode, and a second micro-lens that focuses light on the second photodiode. The saturation charge amount of the second photodiode is larger than that of the first photodiode. Further, the aperture of the second micro-lens is smaller than that of the first micro-lens.

Next, the embodiment is explained in detail with reference to the drawings.

First Embodiment

FIG. 1 is a cross-sectional view showing the structure of unit pixels of a CMOS image sensor according to a first embodiment.

Unit pixels including photodiodes 31, color filters 32 and micro-lenses 33 are two-dimensionally arranged at a preset pitch on a semiconductor substrate 30. An interconnection layer 34 extending over a plurality of unit pixels is provided between the photodiodes 31 and the color filters 32.

Each unit pixel is configured by a first photodiode 31a with a small area (small saturation charge amount) and a second photodiode 31b with a large area (large saturation charge amount) formed on the surface portion of the substrate 30. The first photodiode 31a corresponds to a high-sensitivity pixel and the second photodiode 31b corresponds to a low-sensitivity pixel.

For example, the interconnection layer 34 with the three-layered structure is provided on the substrate 30. Color filters 32a, 32b corresponding to the photodiodes 31a, 31b are provided on the uppermost layer of the interconnection layer 34. A first micro-lens 33a that focuses light on the first photodiode 31a is provided on each color filter 32a. Further, a second micro-lens 33b that focuses light on the second photodiode 31b is provided on each color filter 32b.

The color filter 32a and micro-lens 33a for the first photodiode 31a have a larger area. The color filter 32b and micro-lens 33b for the second photodiode 31b have a smaller area. That is, the aperture of the first micro-lens 33a is larger than that of the second micro-lens 33b. Moreover, the color of the color filters 32a, 32b is the same in the same unit pixel.

In signal reading in the unit pixel, both of signals of the high-sensitivity pixel 31a and low-sensitivity pixel 31b are read at the low-illumination time (dark time) in which an amount of signal charges is small. At the high-illumination time (bright time) in which an amount of signal charges is large, only a signal of the low-sensitivity pixel 31b is read.

Thus, in this embodiment, the high-sensitivity pixel 31a and low-sensitivity pixel 31b are provided in a single unit pixel, both of signals of the high-sensitivity pixel 31a and low-sensitivity pixel 31b are used at the low-illumination time (dark time) and only a signal of the low-sensitivity pixel 31b is used at the high-illumination time (bright time). As a result, the dynamic range can be expanded.

Further, in this embodiment, the area of the high-sensitivity pixel 31a is made small and the area of the low-sensitivity pixel 31b is made large. Therefore, the saturation charge amount of the high-sensitivity pixel 31a becomes small, but the saturation charge amount of the low-sensitivity pixel 31b becomes large. As a result, saturation of the low-sensitivity pixel 31b at the high-illumination time can be suppressed and thus the dynamic range can be further expanded. In this case, the area of the high-sensitivity pixel 31a is made small, but since the amount of light is small at the low-illumination time, the high-sensitivity pixel 31a will not almost be saturated.

Further, even if the high-sensitivity pixel 31a is saturated at the high-illumination time, saturation of the high-sensitivity pixel 31a does not become a problem since only a signal of the low-sensitivity pixel 31b is read.

Thus, according to this embodiment, the photodiode 31a of the high-sensitivity pixel is made small and the photodiode 31b of the low-sensitivity pixel is made larger accordingly to increase the saturation amount of the signal charge amount. As a result, the dynamic range can be further expanded. That is, saturation of the low-sensitivity pixel at the high-illumination time is suppressed in the structure in which each of the unit pixels is configured by two types of pixels including the high-sensitivity pixel and low-sensitivity pixel to further expand the dynamic range.

Second Embodiment

FIG. 2 is a block diagram showing the schematic configuration of a CMOS image sensor according to a second embodiment.

This embodiment is obtained by applying the first embodiment explained before to the prior application (Japanese Patent Application No. 2009-157955) already proposed by the inventor of this application and others.

An imaging region 10 includes a plurality of unit pixels (unit cells) 1(m,n) arranged in m rows and n columns. In this example, one unit cell 1(m,n) of the mth row and nth column among the unit cells and one vertical signal line 11(n) among vertical signal lines formed in a column direction corresponding to respective columns in the imaging region are shown as a representative.

On one-end side of the imaging region 10 (on the left side of the drawing), a vertical shift register 12 that supplies pixel drive signals such as ADRES(m), RESET(m), READ1(m), READ2(m) to the respective rows of the imaging region is arranged.

On the upper-end side of the imaging region 10 (on the upper side of the drawing), a current source 13 connected to the vertical signal line 11(n) of each column is arranged. The current source 13 is operated as a part of a pixel source follower circuit.

On the lower-end side of the imaging region (on the lower side of the drawing), a CDS&ADC 14 including a correlated double sampling (CDS) circuit and analog digital convert (ADC) circuit connected to the vertical signal line 11(n) of each column and a horizontal shift register 15 are arranged. The CDS&ADC 14 subjects an analog output of the pixel to a CDS process and converts the same to a digital output.

A signal level determination circuit 16 determines whether output signal VSIG(n) of the unit cell is smaller or larger than a preset value based on the level of an output signal digitized by the CDS&ADC 14. Then, the circuit supplies the determination output to a timing generator 17 and supplies the same as an analog gain control signal to the CDS&ADC 14.

The timing generator 17 generates an electronic shutter control signal for controlling the storage time of the photodiode, a control signal for switching the operation modes and the like at respective preset timings and supplies the same to the vertical shift register 12.

Each unit cell has the same circuit configuration and, in this embodiment, one high-sensitivity pixel and one low-sensitivity pixel are arranged in each unit cell. In this case, the configuration of the unit cell 1(m,n) in FIG. 2 is explained.

The unit cell 1(m,n) includes a first photodiode PD1, second photodiode PD2, first read transistor READ1, second read transistor READ2, floating diffusion node FD, amplification transistor AMP, reset transistor RST and select transistor ADR. Each of the above transistors is an n-type MOSFET in this example.

PD1 photoelectrically converts incident light to store converted charges. READ1 is connected to PD1 and signal charges of PD1 are read by means of READ1. PD2 photoelectrically converts incident light to store converted charges and is lower in light sensitivity than PD1. READ2 is connected to PD2 and signal charges of PD2 are read by means of READ2. FD is connected to one-side terminals of READ1, READ2 and signal charges read by means of READ1, READ2 are temporarily stored in FD. The gate of AMP is connected to FD and a signal of FD is amplified by means of AMP and output to the vertical signal line 11(n). The source of RST is connected to the gate potential (FD potential) of AMP and the gate potential is reset by RST. ADR controls supply of a power source voltage to AMP to select and control a unit cell in a desired horizontal position in the vertical direction.

Select transistor ADR, Reset transistor RST, first read transistor READ1, second read transistor READ2 are controlled by signal lines ADRES(m), RESET(m), READ1(m), READ2(m) of a corresponding row. Further, one end of amplification transistor AMP is connected to the vertical signal line 11(n) of a corresponding column.

Figure 3A:
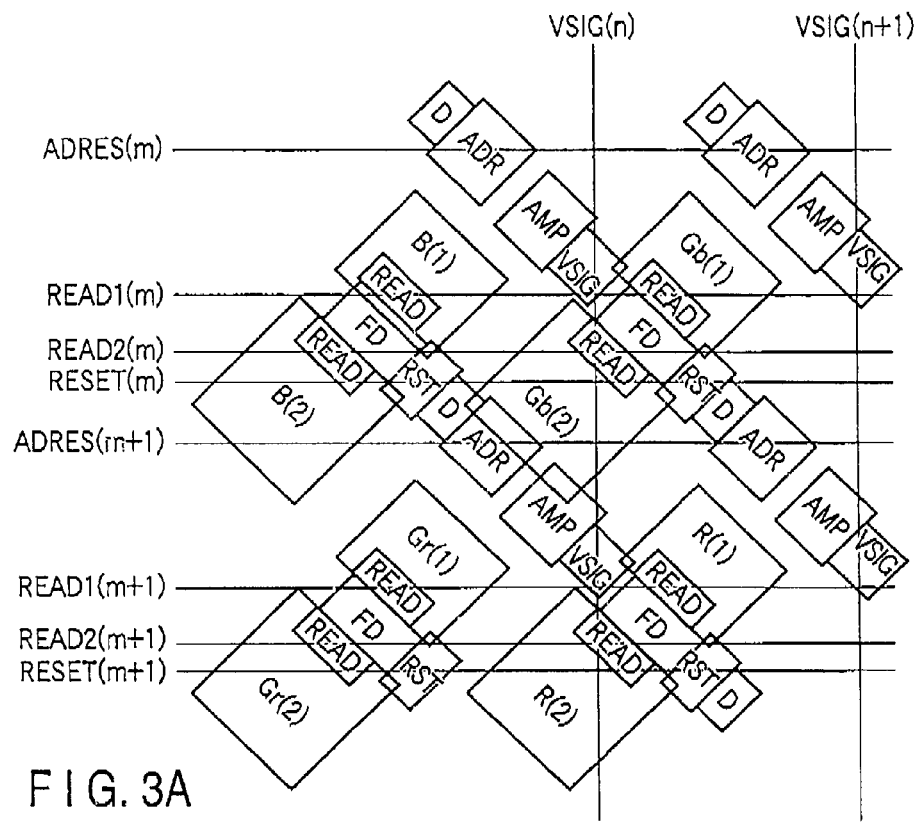
FIGS. 3A, 3B are views each schematically showing a part of a layout image of the CMOS image sensor of FIG. 2.
Figure 3B:
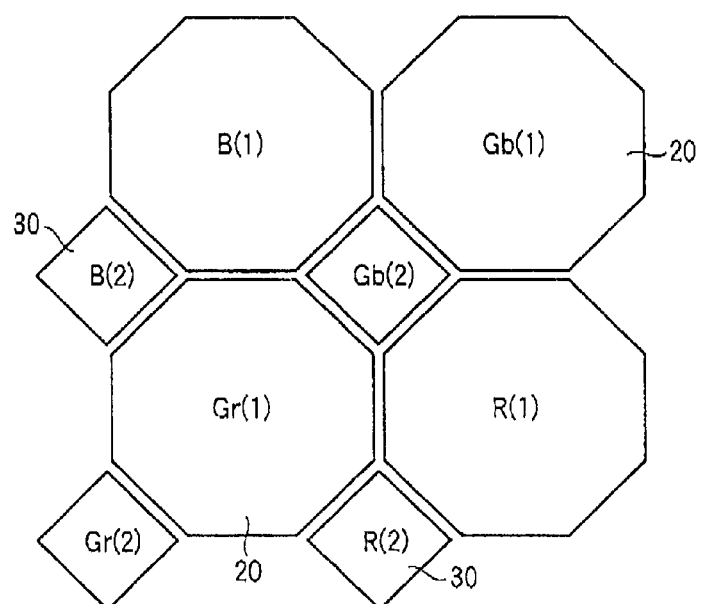

FIG. 3A is a view schematically showing the layout image of an element-forming region and gates of an extracted portion of the imaging region of the CMOS image sensor of FIG. 2. FIG. 3B is a view schematically showing the layout image of color filters • and micro-lenses of an extracted portion of the imaging region of the CMOS image sensor of FIG. 2. The arrangement of the color filters • and micro-lenses utilizes a normal RGB Bayer arrangement.

In FIGS. 3A, 3B, R(1), R(2) indicate regions corresponding to an R pixel, B(1), B(2) indicate regions corresponding to a B pixel and Gb(1), Gb(2), Gr(1), Gr(2) indicate regions corresponding to a G pixel. R(1), B(1), Gb(1), Gr(1) each correspond to the high-sensitivity pixel 31a with a small area and R(2), B(2), Gb(2), Gr(2) each correspond to the low-sensitivity pixel 31b with a large area. D indicates a drain region. Further, signal lines ADRES(m), RESET(m), READ1(m), READ2(m) of an mth row, signal lines ADRES(m+1), RESET(m+1), READ1(m+1), READ2(m+1) of an (m+1)th row, vertical signal line 11(n) of an nth column and vertical signal line 11(n+1) of an (n+1)th column are shown to indicate the correspondence relationship of the signal lines.

For simplifying the explanation, in FIG. 3A, various signal lines are indicated as if they overlap with the pixels, but in practice, the various signal lines are arranged to pass through the peripheral portions of the pixels without overlapping with the pixels.

As shown in FIGS. 3A, 3B, the high-sensitivity pixel and low-sensitivity pixel are arranged in the unit cell. Color filters • and micro-lenses 20 with a large area are placed on the high-sensitivity pixels and color filters • and micro-lenses 30 with a small area are placed on the low-sensitivity pixels.

Figure 4:
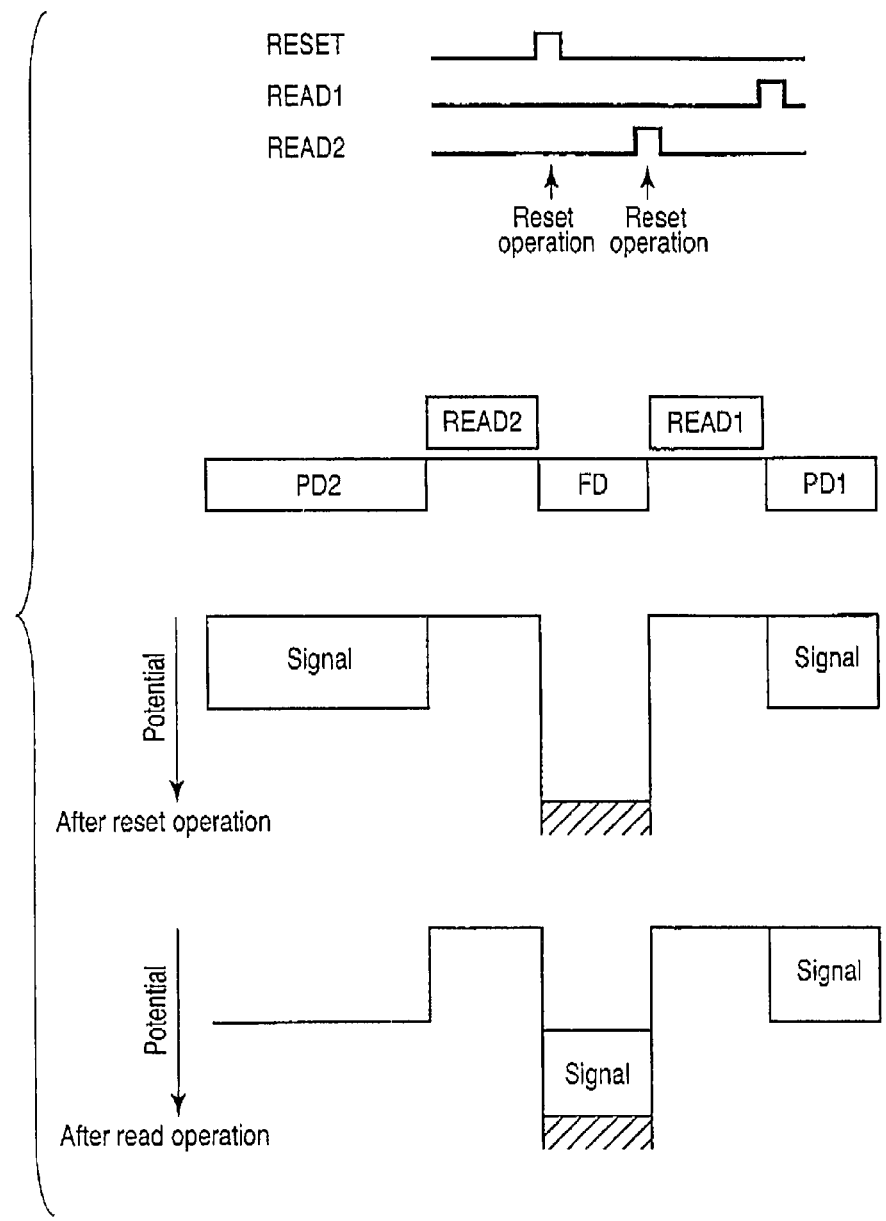
FIG. 4 is a diagram for illustrating the operation timings and potentials of the CMOS image sensor of FIG. 2 (in a high-illumination mode).

FIG. 4 is a diagram showing one example of the operation timings of a pixel, a potential in the semiconductor substrate at the reset operation time and a potential at the read operation time in the CMOS image sensor of FIG. 2. Particularly, this is an example of a low-sensitivity mode suitable for a case wherein the amount of signal charges stored in first and second photodiodes PD1, PD2 is large (bright time). When the amount of signal charges is large, it is required to expand the dynamic range while the sensitivity of the sensor is lowered to prevent the sensor from being saturated.

First, reset transistor RST is turned on to perform the reset operation and then the potential of floating diffusion node FD immediately after the reset operation is set to the same potential level of the drain (the power source of the pixel). After the end of the reset operation, reset transistor RST is turned off. Then, a voltage corresponding to the potential of floating diffusion node FD is output to the vertical signal line 11. The voltage is fetched in a CDS circuit of the CDS&ADC 14 (dark-time level).

Next, first read transistor READ1 or second read transistor READ2 is turned on to transfer signal charges stored so far in photodiode PD1 or PD2 to FD. In the low-sensitivity mode, the read operation of turning on only second read transistor READ2 and transferring only signal charges stored in second photodiode PD2 with lower sensitivity to floating diffusion node FD is performed. At the transfer time of signal charges, the FD potential is changed. Since a voltage corresponding to the potential of floating diffusion node FD is output to the vertical signal line 11, the voltage is fetched in the CDS circuit (signal level). After this, noises such as variation in Vth (threshold value) of amplification transistor AMP are canceled by subtracting the dark-time level from the signal level in the CDS circuit and only a pure signal component is extracted (CDS operation).

For simplifying the explanation, in the low-sensitivity mode, the explanation for the operations of first photodiode PD1 and first read transistor READ1 is omitted. In practice, it is preferable to discharge signal charges stored in first photodiode PD1 by turning on first read transistor READ1 immediately before the reset operation of floating diffusion node FD is performed to prevent signal charges of first photodiode PD1 from overflowing to floating diffusion node FD. Further, first read transistor READ1 may always be kept on in a period other than a period in which the reset operation of floating diffusion node FD and the read operation of a signal from second photodiode PD2 are performed.

FIG. 5 is a diagram showing one example of the operation timings of a pixel, a potential in the semiconductor substrate at the reset operation time and a potential at the read operation time in the CMOS image sensor of FIG. 2. Particularly, this is an example of a high-sensitivity mode suitable for a case wherein the amount of signal charges stored in floating diffusion node FD is small (dark time). When the amount of signal charges of floating diffusion node FD is small, it is required to enhance the S/N ratio by enhancing the sensitivity of the CMOS image sensor.

First, reset transistor RST is turned on to perform the reset operation and then the potential of floating diffusion node FD immediately after the reset operation is set to the same potential level of the drain (the power source of the pixel). After the end of the reset operation, reset transistor RST is turned off. Then, a voltage corresponding to the potential of floating diffusion node FD is output to the vertical signal line 11. The voltage is fetched in a CDS circuit of the CDS&ADC 14 (dark-time level).

Next, first and second read transistors READ1, READ2 are turned on to transfer signal charges stored so far in photodiodes PD1 and PD2 to floating diffusion node FD. In the high-sensitivity mode, the read operation of turning on both of first and second read transistors READ1 and READ2 and transferring all of signal charges acquired in the dark state to floating diffusion node FD is performed. At the transfer time of signal charges, the FD potential is changed. Since a voltage corresponding to the potential of floating diffusion node FD is output to the vertical signal line 11, the voltage is fetched in the CDS circuit (signal level). After this, noises such as variation in Vth of amplification transistor AMP are canceled by subtracting the dark-time level from the signal level and only a pure signal component is extracted (CDS operation).

Generally, thermal noise generated in amplification transistor AMP and 1/f noise occupy a large part of entire noises generated in the CMOS image sensor. Therefore, an increase in the signal level by adding a signal at the stage of transferring the signal to floating diffusion node FD before noise is generated as in the CMOS image sensor in the present embodiment is advantageous in enhancing the S/N ratio. Further, since the number of pixels is reduced by adding a signal at the stage of transferring the signal to floating diffusion node FD, the effect that the frame rate of the CMOS image sensor can be easily raised is obtained.

As signal charge adding means, the operation is not necessarily limited to addition of signal charges in floating diffusion node FD. Signal charges of first and second photodiodes PD1, PD2 may be separately output by use of a pixel source follower circuit. In this case, not simple addition of signal charges of first and second photodiodes PD1, PD2 but weighted addition with the ratio of 2:1, for example, may be performed in a signal processing circuit outside the CMOS image sensor.

As described above, in this embodiment, one high-sensitivity pixel and one low-sensitivity pixel are arranged in each unit cell in the CMOS image sensor. When the signal charge amount is small, both of the signals of the high-sensitivity pixel and low-sensitivity pixel are used. At this time, signal charges may be added in the unit cell and read. Further, when the signal charge amount is large, only the signal of the low-sensitivity pixel is used. Thus, the two operation modes are selectively used.

Since one high-sensitivity pixel and one low-sensitivity pixel are arranged in each unit cell in this embodiment, the relationship of the following equations (1) may be considered to be set. That is, suppose that the light sensitivity/saturation level of the conventional pixel, the light sensitivity/saturation level of the high-sensitivity pixel and the light sensitivity/saturation level of the low-sensitivity pixel are expressed as follows:

Light sensitivity of conventional pixel: SENS
Saturation level of conventional pixel: VSAT
Light sensitivity of high-sensitivity pixel: SENS1
Saturation level of high-sensitivity pixel: VSAT1
Light sensitivity of low-sensitivity pixel: SENS2
Saturation level of low-sensitivity pixel: VSAT2
Then, the following equations are obtained.

$$SENS=SENS1+SENS2, VSAT=VSAT1+VSAT2 \quad (1)$$

If the high-sensitivity pixel is saturated and the mode is switched to a low-sensitivity mode, the signal charge amount obtained is reduced and the S/N ratio is lowered. A light amount by which the high-sensitivity pixel is saturated is expressed by VSAT1/SENS1. A signal output of the low-sensitivity pixel with the above light amount becomes VSAT1×SENS2/SENS1. Therefore, the reduction rate of the signal output with the light amount is expressed by the following equation.

$$(VSAT1 \times SENS2/SENS1)/(VSAT1 \times SENS/SENS1) = SENS2/SENS \quad (2)$$

Since it is desired to avoid a lowering in the signal at the switching time of high-sensitivity/low-sensitivity modes, it is considered adequate to set SENS2/SENS between 10% and 50%. In this embodiment, SENS2/SENS is set to ¼=25%.

On the other hand, the dynamic range expanding effect is expressed by the following expression by taking the ratio of the maximum incident light amount VSAT2/SENS2 in the low-sensitivity mode to the maximum incident light amount (dynamic range) VSAT/SENS of the conventional pixel.

$$(VSAT2/VSAT) \times (SENS/SENS2) \qquad (3)$$

As is clearly understood from expression (3), it is preferable to increase VSAT2/VSAT as far as possible. This means that it is preferable to set the saturation level of the low-sensitivity pixel larger than the saturation level of the high-sensitivity pixel. This is expressed by the following expression.

$$VSAT1/SENS1 < VSAT2/SENS2$$

When the above expression is satisfied, the dynamic range can be expanded.

Figure 6A:
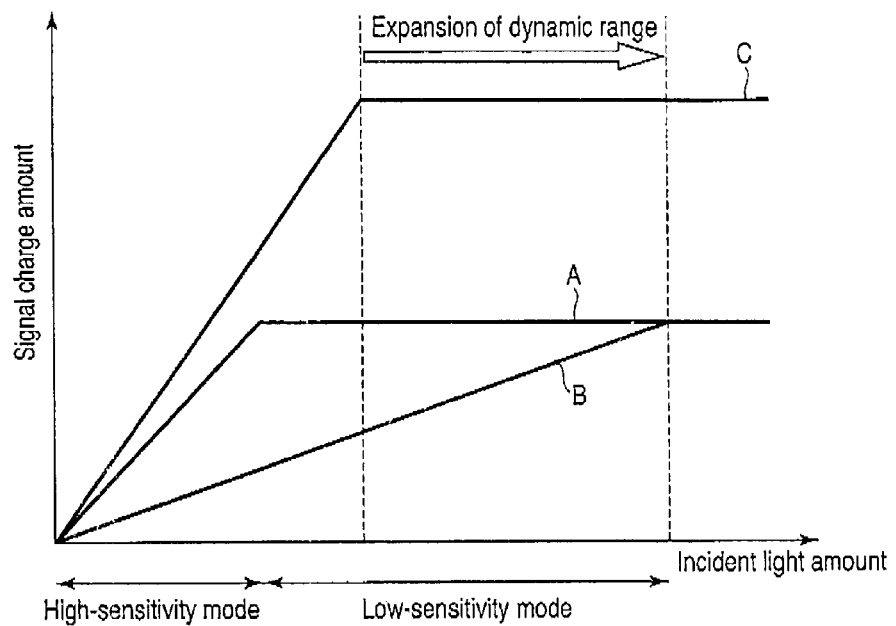
FIGS. 6A, 6B are characteristic diagrams for illustrating the dynamic range expansion effect of the CMOS image sensor of FIG. 2.
Figure 6B:
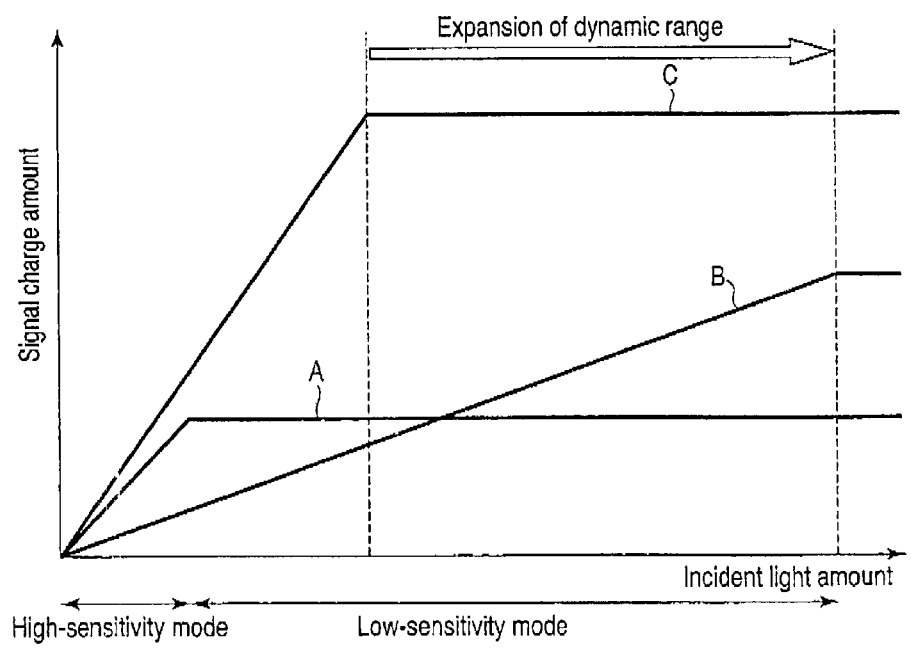

FIGS. 6A, 6B are diagrams showing examples of characteristics for illustrating the dynamic range expanding effect of the CMOS image sensor of this embodiment. In FIGS. 6A, 6B, the abscissa indicates an incident light amount and the ordinate indicates a signal charge amount generated in the photodiode. In this example, A indicates the characteristic of a high-sensitivity pixel (PD1), B indicates the characteristic of a low-sensitivity pixel (PD2) and C indicates the characteristic of a pixel (conventional pixel) of the conventional unit pixel.

In this embodiment, the light sensitivity of high-sensitivity pixel A is set to ¾ of that of the conventional pixel and the light sensitivity of low-sensitivity pixel B is set to ¼ of that of the conventional pixel C. FIG. 6A shows a comparison example and, in this case, it is assumed that the sizes of high-sensitivity pixel A and low-sensitivity pixel B are set to the same size, the saturation level of high-sensitivity pixel A is set to ½ of that of the conventional pixel C and the saturation level of low-sensitivity pixel B is set to ½ of that of the conventional pixel C.

In this case, the light sensitivity of high-sensitivity pixel A is set to ¾ of that of the conventional pixel and the light sensitivity of low-sensitivity pixel B is set to ¼ of that of the conventional pixel C. Therefore, in the high-sensitivity mode in which outputs of high-sensitivity pixel A and low-sensitivity pixel B are added together, the signal charge amount becomes equivalent to that of the conventional unit pixel C.

Further, since the saturation level of low-sensitivity pixel B is set to ½ of that of the conventional pixel C and the light sensitivity thereof is set to ¼ of that of the latter, the range in which low-sensitivity pixel B is operated without being saturated is increased to twice that of the conventional pixel C. That is, it is understood that the dynamic range of low-sensitivity pixel B is expanded twice that of the conventional pixel C in the low-sensitivity mode in which an output of low-sensitivity pixel B is used.

On the other hand, in this embodiment, when the saturation level of high-sensitivity pixel A is set low and the saturation level of low-sensitivity pixel B is set high, the saturation level of high-sensitivity pixel A is set lower than ½ of that of the conventional pixel C and the saturation level of low-sensitivity pixel B is set higher than ½ of that of the conventional pixel C as shown in FIG. 6B.

In this case, an illumination amount at which the saturation level of low-sensitivity pixel B is reached at the high-illumination time (bright time) that is the low-sensitivity mode can be increased by increasing the saturation level of low-sensitivity pixel B.

Third Embodiment

Figure 7:
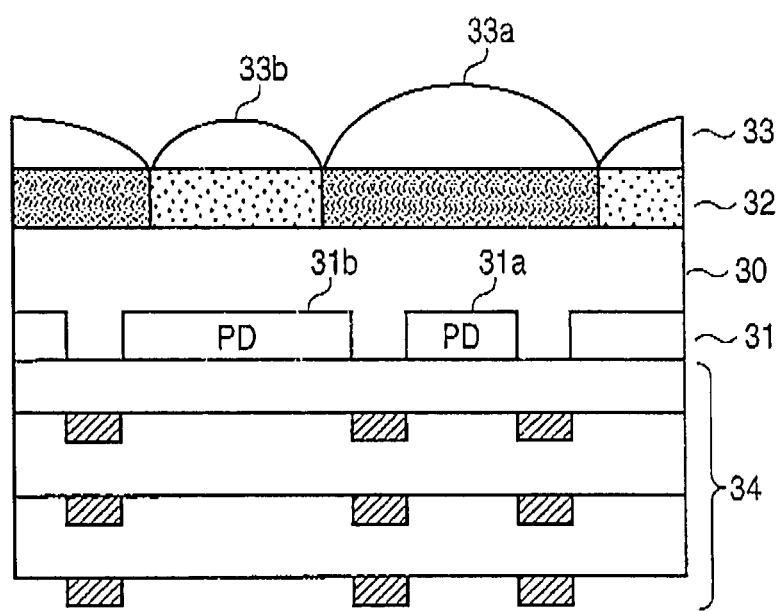
FIG. 7 is a cross-sectional view showing the structure of unit pixels of a CMOS image sensor according to a third embodiment.

FIG. 7 is a cross-sectional view showing the structure of unit cells of a CMOS image sensor according to a third embodiment. Portions that are the same as those of FIG. 1 are denoted by the same symbols and the detailed explanation thereof is omitted.

This embodiment is an example in which the idea of setting the saturation charge amount of a low-sensitivity pixel larger than the saturation charge amount of a high-sensitivity pixel is applied to a back-illumination type CMOS image sensor.

The basic structure is the same as that of the first embodiment. This embodiment is different from the first embodiment in that the micro-lens 33 and color filter 32 are arranged on the backside of a substrate 30. The relationship between high-sensitivity pixels 31a, low-sensitivity pixels 31b and micro-lenses 33a, 33b is the same as that of the first embodiment.

With this structure, the same effect as that of the first embodiment can of course be obtained.

(Modification)

This invention is not limited to the above embodiments. In the above embodiments, the CMOS image sensor is explained as an example, but this invention is not limited to the CMOS image sensor and can be applied to a CCD image sensor. Further, the circuit configuration shown in FIG. 2 is shown as an example and this invention can be applied to various types of solid-state imaging devices having high-sensitivity pixels and low-sensitivity pixels.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
   a semiconductor substrate; and
   a plurality of pixels two-dimensionally arranged at a preset pitch in the semiconductor substrate,
   wherein each of the pixels includes:
   a first photodiode configured to photoelectrically convert incident light and store charges obtained by conversion;
   a second photodiode configured to photoelectrically convert incident light and store charges obtained by conversion and having a larger saturation charge amount than the first photodiode, the second photodiode having a larger area than the first photodiode;
   a first micro-lens configured to focus light on the first photodiode; and
   a second micro-lens configured to focus light on the second photodiode and an area of the second micro-lens being smaller than an area of the first micro-lens.

2. The device according to claim 1, further comprising:
   a first read transistor connected to the first photodiode and configured to read the stored charges,
   a second read transistor connected to the second photodiode and configured to read the stored charges,
   a floating diffusion node that is connected to the first and second read transistors and stores the read charges,
   a reset transistor configured to reset a potential of the floating diffusion node, and
   an amplification transistor configured to amplify the potential of the floating diffusion node.

3. The device according to claim 2, further comprising a shift register configured to perform a first operation mode in which the charges of both of the first and second photodiodes are read to the floating diffusion node and added together and a potential of the floating diffusion node obtained by addition is amplified and output, and a second operation mode in which the charges of the second photodiode are read to the floating diffusion node and a potential of the floating diffusion node obtained by reading is amplified and output.

4. The device according to claim 2, further comprising a shift register configured to perform a first operation mode in which signals obtained by separately reading the charges of the first and second photodiodes are output, and a second operation mode in which a signal obtained by reading the charges of the second photodiode is output.

5. The device according to claim 4, wherein the separately read signals are weighted with a preset ratio and added together in the first operation mode.

6. The device according to claim 3, wherein the relationship of VSAT1/SENS1<VSAT2/SENS2 is satisfied when light sensitivity of the first photodiode is SENS1, a saturation level thereof is VSAT1, light sensitivity of the second photodiode is SENS2 and a saturation level thereof is VSAT2.

7. The device according to claim 1, wherein the first and second micro-lenses are arranged in a checkered form.

8. The device according to claim 1, wherein the pixels are formed on a surface portion of the semiconductor substrate and the micro-lenses are formed above a front surface of the semiconductor substrate.

9. The device according to claim 1, wherein the pixels are formed on a surface portion of the semiconductor substrate and the micro-lenses are formed on a back surface of the semiconductor substrate.

10. The device according to claim 1, further comprising:
a first color filter corresponding to the first photodiode; and
a second color filter corresponding to the second photodiode,
the first and second color filters being an identical color for an identical pixel.

11. A solid-state imaging device comprising:
a semiconductor substrate;
an imaging region formed by arranging a plurality of pixels two-dimensionally arranged at a preset pitch in a row direction and column direction in the semiconductor substrate;
a vertical shift register that is provided adjacent to one end portion of the imaging region in the row direction and supplies an image drive signal to each row of the imaging region; and
a horizontal shift register that is provided adjacent to one end portion of the imaging region in the column direction and fetches a signal from each column of the imaging region,
wherein each of the pixels includes:
a first photodiode configured to photoelectrically convert incident light and store charges obtained by conversion;
a second photodiode configured to photoelectrically convert incident light and store charges obtained by conversion and having a larger saturation charge amount than the first photodiode, the second photodiode having a larger area than the first photodiode;
a first micro-lens configured to focus light on the first photodiode; and
a second micro-lens configured to focus light on the second photodiode and an area of the second micro-lens being smaller than an area of the first micro-lens.

12. The device according to claim 11, further comprising:
a first read transistor connected to the first photodiode and configured to read the stored charges,
a second read transistor connected to the second photodiode and configured to read the stored charges,
a floating diffusion node that is connected to the first and second read transistors and stores the read charges,
a reset transistor configured to reset a potential of the floating diffusion node, and
an amplification transistor configured to amplify the potential of the floating diffusion node.

13. The device according to claim 12, wherein the vertical shift register performs a first operation mode in which the charges of both of the first and second photodiodes are read to the floating diffusion node and added and a potential of the floating diffusion node obtained by addition is amplified and output, and a second operation mode in which the charges of the second photodiode are read to the floating diffusion node and a potential of the floating diffusion node obtained by reading is amplified and output.

14. The device according to claim 12, wherein the vertical shift register performs a first operation mode in which signals obtained by separately reading the charges of the first and second photodiodes are output, and a second operation mode in which a signal obtained by reading the charges of the second photodiode is output.

15. The device according to claim 14, wherein the separately read signals are weighted with a preset ratio and added together in the first operation mode.

16. The device according to claim 13, wherein the relationship of VSAT1/SENS1<VSAT2/SENS2 is satisfied when light sensitivity of the first photodiode is SENS1, a saturation level thereof is VSAT1, light sensitivity of the second photodiode is SENS2 and a saturation level thereof is VSAT2.

17. The device according to claim 11, wherein the first and second micro-lenses are arranged in a checkered form.

18. The device according to claim 11, wherein the pixels are formed on a surface portion of the semiconductor substrate and the micro-lenses are formed above a front surface of the semiconductor substrate.

19. The device according to claim 11, wherein the pixels are formed on a surface portion of the semiconductor substrate and the micro-lenses are formed on a back surface of the semiconductor substrate.

20. The device according to claim 11, further comprising:
a first color filter corresponding to the first photodiode; and
a second color filter corresponding to the second photodiode,
the first and second color filters being an identical color for an identical pixel.

* * * * *